(12) United States Patent
Miyasaka

(10) Patent No.: US 10,036,942 B2
(45) Date of Patent: Jul. 31, 2018

(54) JOINED BODY, ELECTRONIC DEVICE, PROJECTOR, AND MANUFACTURING METHOD OF JOINED BODY

(71) Applicant: Seiko Epson Corporation, Tokyo (JP)

(72) Inventor: Hideo Miyasaka, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/237,995

(22) Filed: Aug. 16, 2016

(65) Prior Publication Data

US 2017/0052433 A1 Feb. 23, 2017

(30) Foreign Application Priority Data

Aug. 18, 2015 (JP) ................... 2015-160835

(51) Int. Cl.
| | | |
|---|---|---|
| *G03B 21/16* | (2006.01) | |
| *B22F 7/06* | (2006.01) | |
| *H01L 23/367* | (2006.01) | |
| *H01L 33/64* | (2010.01) | |
| *H01L 33/00* | (2010.01) | |
| *B22F 7/00* | (2006.01) | |
| *G03B 43/00* | (2006.01) | |

(52) U.S. Cl.
CPC ............. *G03B 21/16* (2013.01); *B22F 7/004* (2013.01); *B22F 7/064* (2013.01); *H01L 23/367* (2013.01); *G03B 43/00* (2013.01); *H01L 33/0045* (2013.01); *H01L 33/641* (2013.01); *H01L 2224/48091* (2013.01); *H01L 2224/73265* (2013.01); *H01L 2924/19107* (2013.01)

(58) Field of Classification Search
None
See application file for complete search history.

(56) References Cited

U.S. PATENT DOCUMENTS

| | | | |
|---|---|---|---|
| 2010/0187678 A1* | 7/2010 | Kajiwara | H01L 21/56 257/692 |
| 2010/0230086 A1 | 9/2010 | Tsuzuki et al. | |
| 2010/0282459 A1* | 11/2010 | Leonhardt | C04B 41/009 165/185 |
| 2016/0219693 A1* | 7/2016 | Nishimoto | H01L 23/3735 |
| 2017/0338190 A1* | 11/2017 | Fujino | H01L 23/562 |

FOREIGN PATENT DOCUMENTS

| | | |
|---|---|---|
| JP | 2009-026953 A | 2/2009 |
| JP | 2009-206331 A | 9/2009 |
| JP | 2014-063995 A | 4/2014 |
| JP | 2014-146739 A | 8/2014 |

* cited by examiner

*Primary Examiner* — Su C Kim
*Assistant Examiner* — David S Wilbert
(74) *Attorney, Agent, or Firm* — Harness, Dickey & Pierce, P.L.C.

(57) ABSTRACT

A light emitting device includes a semiconductor light emitting element; a mounting substrate; a support substrate; a joining layer which joins the semiconductor light emitting element and the mounting substrate together, is a sintered body of metal particles, and has a pore; and a joining layer which joins the mounting substrate and the support substrate together, is a sintered body of metal particles, and has a pore, in which a porosity of the joining layer is lower than a porosity of the joining layer.

15 Claims, 6 Drawing Sheets

JOINED BODY, ELECTRONIC DEVICE, PROJECTOR, AND MANUFACTURING METHOD OF JOINED BODY

BACKGROUND

1. Technical Field

The present invention relates to a joined body, an electronic device, a projector, and a manufacturing method of a joined body.

2. Related Art

For example, in JP-A-2009-206331, a heat transfer member including an exothermic body (a first member), a counter member (a second member), a substrate (a third member), a brazing portion (a first joining layer) which joins the exothermic body and the counter member together, and a metal film (a second joining layer) which joins the counter member and the substrate together is disclosed. Further, a thermal expansion coefficient of the metal film is lower than a thermal expansion coefficient of the substrate and is higher than a thermal expansion coefficient of the counter member, and a groove (a space portion) for allowing thermal deformation is formed in the metal film. According to such a configuration, it is possible to absorb a thermal expansion difference (a difference in an expanded length due to a difference in the thermal expansion coefficient) between the counter member and the substrate, and it is possible to suppress cracks in the metal film.

However, in JP-A-2009-206331, the configuration of the brazing portion is not described in detail, and the thermal expansion difference between the exothermic body and the counter member is not able to be absorbed according to the configuration of the brazing portion, and thus, the brazing portion or the counter member may be damaged. In addition, heat generated from the exothermic body may not be able to be efficiently radiated according to the configuration of the brazing portion.

SUMMARY

An advantage of some aspects of the invention is to provide a joined body capable of efficiently radiating heat generated from a first member which is an exothermic body and of suppressing damage of each portion, an electronic device, a projector, and a manufacturing method of a joined body.

The advantage can be achieved by the following configurations.

A joined body according to an aspect of the invention includes a first member which is an exothermic body; a second member; a third member; a first joining layer which joins the first member and the second member together, is a sintered body of metal particles, and has a pore; and a second joining layer which joins the second member and the third member together, is a sintered body of metal particles, and has a pore, in which a porosity of the first joining layer is lower than a porosity of the second joining layer.

With this configuration, it is possible to obtain a joined body capable of efficiently radiating heat generated from the first member which is an exothermic body and of suppressing damage of each portion.

In the joined body according to the aspect of the invention, it is preferable that a difference between a thermal expansion coefficient of the first member and a thermal expansion coefficient of the second member is less than a difference between the thermal expansion coefficient of the second member and a thermal expansion coefficient of the third member.

With this configuration, it is possible to more reliably absorb (relax) a thermal expansion difference between the first member and the second member in the first joining layer, and it is possible to more reliably absorb (relax) a thermal expansion difference between the second member and the third member in the second joining layer.

In the joined body according to the aspect of the invention, it is preferable that the second joining layer is thicker than the first joining layer.

With this configuration, it is possible to improve heat transfer properties of the second joining layer and to more effectively absorb (relax) the thermal expansion difference between the second member and the third member.

In the joined body according to the aspect of the invention, it is preferable that the porosity of the first joining layer is greater than or equal to 5 volume % and less than or equal to 30 volume %, and the porosity of the second joining layer is greater than or equal to 20 volume % and less than or equal to 40 volume %.

With this configuration, it is possible to effectively absorb the thermal expansion difference, and to obtain a first joining layer and a second joining layer having excellent heat transfer properties.

An electronic device according to another aspect of the invention includes the joined body according to the aspect of the invention, in which the first member is a semiconductor light emitting element, an electric circuit, or a power semiconductor element.

With this configuration, it is possible to obtain an electronic device having high reliability.

A projector according to still another aspect of the invention includes a light emitting device including the joined body according to the aspect of the invention in which the first member is a semiconductor light emitting element; a light modulating unit which modulates light exiting from the light emitting device according to image information; and a projecting unit which projects an image formed by the light modulating unit.

With this configuration, it is possible to obtain an electronic device having high reliability.

A manufacturing method of a joined body according to yet another aspect of the invention includes a first calcining step of arranging a first metal paste containing metal particles between a first member, which is an exothermic body, and a second member, and of calcining the first metal paste by heating; and a second calcining step of arranging a second metal paste containing metal particles between the second member and the third member, and of simultaneously calcining the first metal paste and the second metal paste by heating, in which a porosity of a sintered body of the first metal paste is lower than a porosity of a sintered body of the second metal paste.

With this configuration, it is possible to obtain a joined body capable of efficiently radiating heat generated from the first member which is an exothermic body and of suppressing damage of each portion.

In the manufacturing method of a joined body according to the aspect of the invention, it is preferable that a calcining temperature of the second calcining step is lower than a calcining temperature of the first calcining step.

With this configuration, it is possible to more simply set the porosity of the sintered body of the first metal paste to be lower than the porosity of the sintered body of the second metal paste.

In the manufacturing method of a joined body according to the aspect of the invention, it is preferable that a calcining time of the second calcining step is shorter than a calcining time of the first calcining step.

With this configuration, it is possible to more simply set the porosity of the sintered body of the first metal paste to be lower than the porosity of the sintered body of the second metal paste.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a joined body, an electronic device, a projector, and a manufacturing method of a joined body according to the invention will be described in detail on the basis of embodiments illustrated in the appended drawings.

First Embodiment

Figure 1:
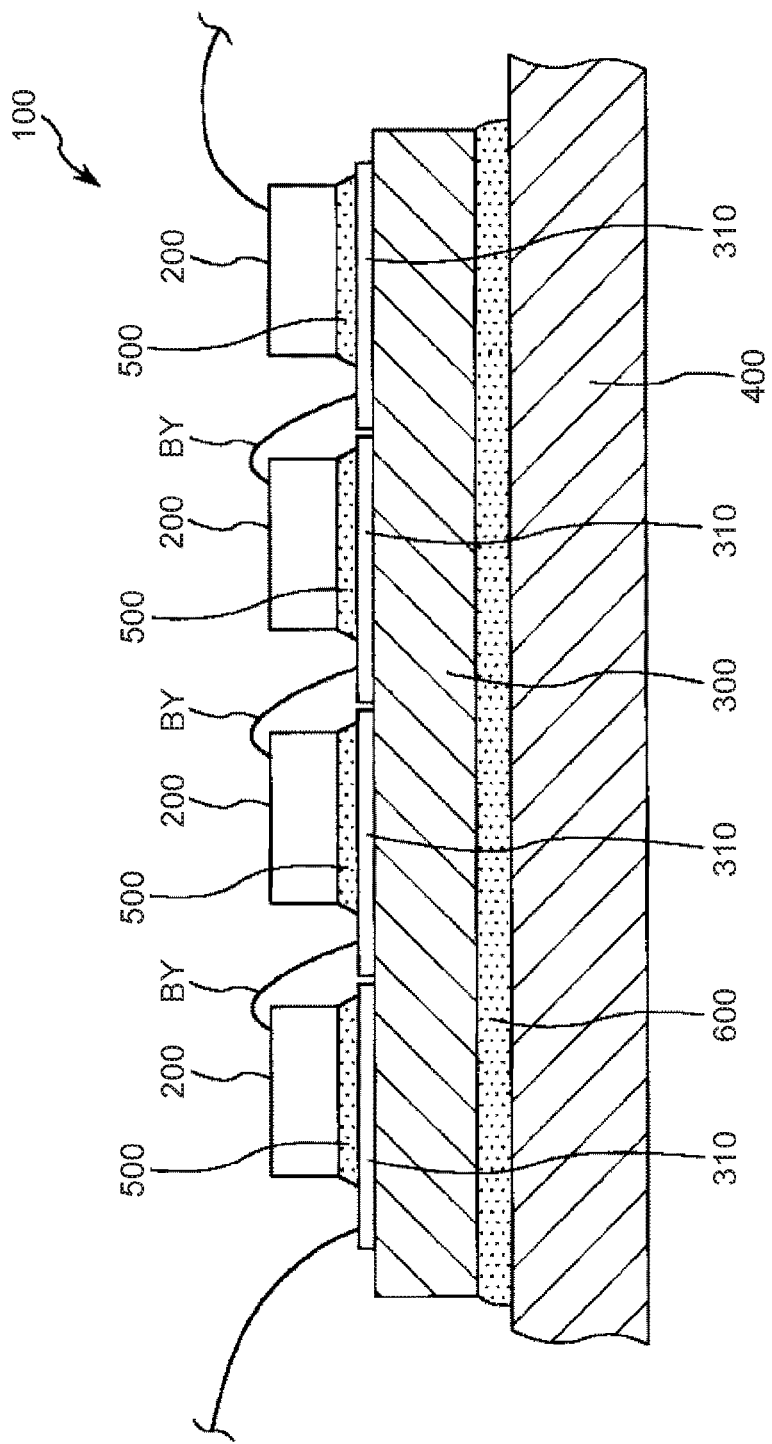
FIG. 1 is a sectional view illustrating a light emitting device (an electronic device) according to a first embodiment of the invention.
Figure 2:
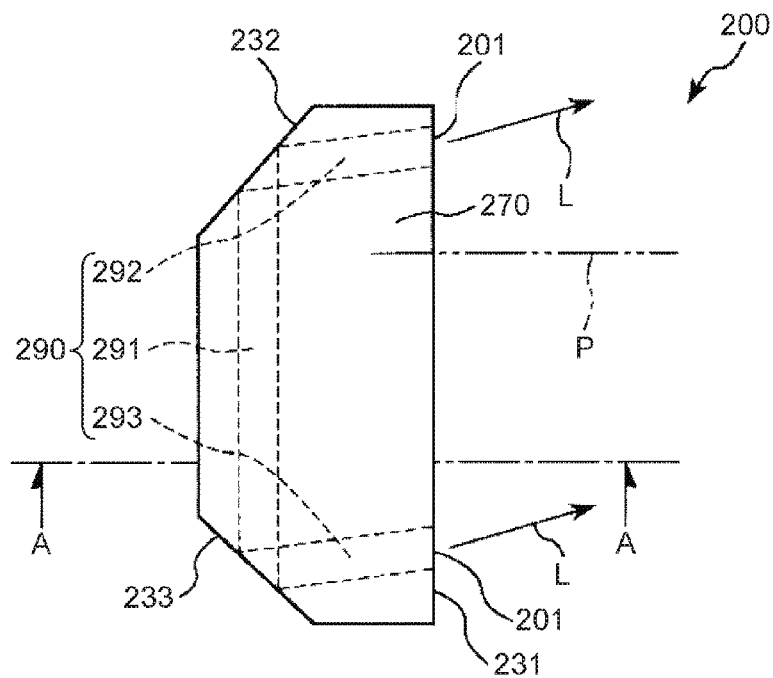
FIG. 2 is a plan view of a semiconductor light emitting element included in the light emitting device illustrated in FIG. 1.
Figure 3:
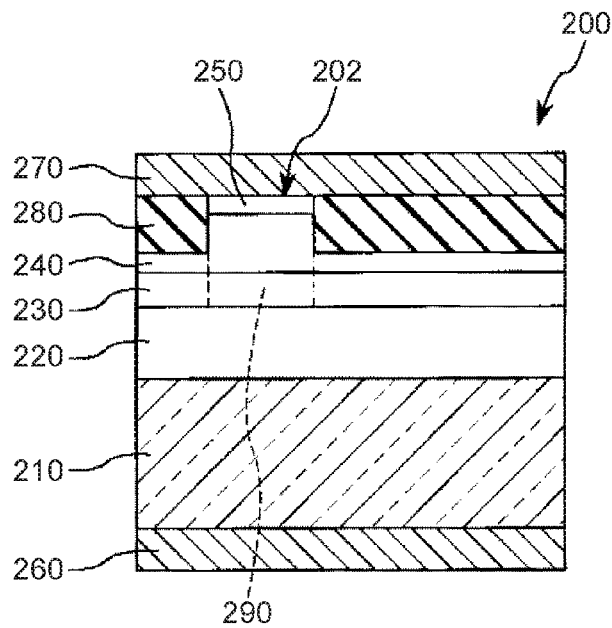
FIG. 3 is a sectional view cut along line A-A of FIG. 2.
Figure 4:
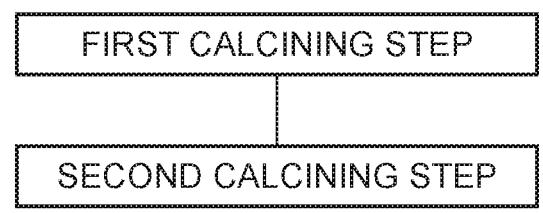
FIG. 4 is a flowchart illustrating a manufacturing method of the light emitting device illustrated in FIG. 1.

FIG. 1 is a sectional view illustrating a light emitting device (an electronic device) according to a first embodiment of the invention. FIG. 2 is a plan view of a semiconductor light emitting element included in the light emitting device illustrated in FIG. 1. FIG. 3 is a sectional view cut along line A-A of FIG. 2. FIG. 4 is a flowchart illustrating a manufacturing method of the light emitting device illustrated in FIG. 1. FIG. 5 to FIG. 9 are respectively sectional views illustrating the manufacturing method of the light emitting device illustrated in FIG. 1.

A light emitting device (an electronic device, a joined body) 100 illustrated in FIG. 1 includes a semiconductor light emitting element (a first member) 200 which is an exothermic body, a mounting substrate (a second member) 300 on which the semiconductor light emitting element 200 is mounted, a support substrate (a third member) 400 on which the mounting substrate 300 is supported, a joining layer (a first joining layer) 500 which joins the semiconductor light emitting element 200 and the mounting substrate 300 together, and a joining layer (a second joining layer) 600 which joins the mounting substrate 300 and the support substrate 400 together. Such a light emitting device 100 has a configuration in which heat generated from the semiconductor light emitting element 200 is transferred to the support substrate 400, and the heat is radiated (diffused) by the support substrate 400.

Furthermore, in the electronic device of this embodiment, the semiconductor light emitting element is used as the exothermic body (the first member), but the exothermic body (the first member) is not particularly limited, and may be an element generating heat. For example, the exothermic body (the first member) may be a semiconductor element such as a power semiconductor element other than the light emitting element, or may be an electric circuit such as an IC chip. The power semiconductor element, for example, indicates a semiconductor controlling or supplying of a power source (power), such as converting an alternating current into a direct current, dropping a voltage, driving a motor, charging a battery, or operating a microcomputer or LSI.

Hereinafter, the configuration of the light emitting device 100 will be described in detail.

Semiconductor Light Emitting Element 200

The semiconductor light emitting element 200 is a super luminescent diode (SLD). SLD, for example, is able to reduce spectrum noise compared to a semiconductor laser, and is able to obtain high output compared to LED, and thus, for example, SLD is suitable for a case where the semiconductor light emitting element 200 is used in a light source of a projector or the like. However, the semiconductor light emitting element 200 is not limited to SLD, and for example, the semiconductor light emitting element 200 may be a semiconductor laser or LED.

As illustrated in FIG. 2 and FIG. 3, the semiconductor light emitting element 200 has a configuration in which a substrate 210, a first clad layer 220, an active layer 230, a second clad layer 240, a contact layer 250, a first electrode 260, a second electrode 270, and an insulating portion 280 are laminated.

For example, a first conductive (for example, n type) GaAs substrate, and the like are able to be used as the substrate 210.

The first clad layer 220 is formed on the substrate 210. For example, an n type InGaAlP layer and the like are able to be used as the first clad layer 220.

The active layer 230 is formed on the first clad layer 220. The active layer 230, for example, is able to have a multiple quantum well (MQW) structure in which three quantum well structures configured of an InGaP well layer and an InGaAlP barrier layer are superimposed. In this embodiment, the active layer 230 includes a first side surface 231 on which a light exiting portion 201 is formed, and a second side surface 232 and a third side surface 233 which are inclined to the first side surface 231.

A part of the active layer 230 configures a gain region group 290 including a first gain region 291, a second gain region 292, and a third gain region 293. The gain regions 291, 292, and 293 are able to generate light, and the light is able to be wave-guided into the gain regions 291, 292, and 293 while receiving a gain. Furthermore, in this embodiment, one gain region group 290 is disposed, and the number of gain region groups 290 is not limited to one.

The first gain region 291 is disposed from the second side surface 232 to the third side surface 233, and is disposed to be parallel to the first side surface 231. In addition, the second gain region 292 is disposed from the second side surface 232 to the first side surface 231, and is superimposed on the first gain region 291 in the second side surface 232. In addition, the third gain region 293 is disposed from the third side surface 233 to the first side surface 231, and is superimposed on the first gain region 291 in the third side surface 233.

In addition, in the light generated in the gain regions 291, 292, and 293, the reflectivity of the first side surface 231 is lower than the reflectivity of the second side surface 232 and the reflectivity of the third side surface 233. Accordingly, a connect portion between the second gain region 292 and the first side surface 231 and a connect portion between the third gain region 293 and the first side surface 231 are able to become the light exiting portion 201. In addition, side surfaces 232 and 233 are able to become a reflective surface.

The gain regions 292 and 293 are inclined to a perpendicular line P of the first side surface 231. Accordingly, the light generated in the gain regions 291, 292, and 293 is not able to be directly subjected to multiple reflection between an end surface of the first side surface 231 in the second gain region 292 and an end surface of the first side surface 231 in the third gain region 293. As a result thereof, a direct resonator is not able to be configured, and thus, it is possible to suppress or prevent laser oscillation of the light generated in the gain regions 291, 292, and 293.

The second clad layer 240 is formed on the active layer 230. For example, a second conductive (for example, p type) InGaAlP layer and the like are able to be used as the second clad layer 240. For example, a pin diode is configured of the p type second clad layer 240, the active layer 230 which is not doped with impurities, and the n type first clad layer 220. Each of the first clad layer 220 and the second clad layer 240 is a layer having a forbidden band which is greater than that of the active layer 230 and a refractive index which is less than that of the active layer 230. The active layer 230 has a function of generating light, and of wave-guiding the light while amplifying the light. The first clad layer 220 and the second clad layer 240 have a function of confining injection carriers (electrons and holes) and light by interposing the active layer 230 therebetween (a function of suppressing a light leakage).

A part of the contact layer 250 and the second clad layer 240 configures a cylindrical portion 202. The planar shape of the cylindrical portion 202 is identical to the planar shape of the gain regions 291, 292, and 293. In other words, a current path between the first electrode 260 and the second electrode 270 is determined according to the planar shape of the cylindrical portion 202, and as a result thereof, the planar shape of the gain regions 291, 292, and 293 is determined.

The insulating portion 280 is disposed on the second clad layer 240 and on the side of the cylindrical portion 202. For example, an SiN layer, an $SiO_2$ layer, an SiON layer, an $Al_2O_3$ layer, and a polyimide layer are able to be used as the insulating portion 280. In a case where the materials described above are used as the insulating portion 280, a current between the first and second electrodes 260 and 270 is able to avoid the insulating portion 280 and to flow through the cylindrical portion 202 which is interposed in the insulating portion 280. The insulating portion 280 has a refractive index which is less than the refractive index of the active layer 230. In this case, the effective refractive index of a perpendicular sectional surface in a portion where the insulating portion 280 is formed is less than the effective refractive index of a perpendicular sectional surface in a portion where the insulating portion 280 is not formed, that is, a portion where the cylindrical portion 202 is formed. Accordingly, in a planar direction, it is possible to efficiently confine light to the gain regions 291, 292, and 293.

The first electrode 260 is formed on the lower entire surface of the substrate 210. For example, an electrode in which a Cr layer, an AuGe layer, an Ni layer, and an Au layer are laminated in this order from the substrate 210 side is able to be used as the first electrode 260.

The second electrode 270 is formed on the contact layer 250. For example, an electrode in which a Cr layer, an AuZn layer, and an Au layer are laminated in this order from the contact layer 250 side is able to be used as the second electrode 270.

In the semiconductor light emitting element 200 having such a configuration, in a case where a forward bias voltage of the pin diode is applied between the first electrode 260 and the second electrode 270 (a current is injected), the gain regions 291, 292, and 293 are generated in the active layer 230, and electrons and holes are re-bonded to each other in the gain regions 291, 292, and 293. According to the re-bonding, light is emitted. Inductive emission successively occurs from the emitted light as a starting point, and the intensity of the light is amplified in the gain regions 291, 292, and 293. Thus, the light of which the intensity is amplified exits from the light exiting portion 201 as light L. That is, the semiconductor light emitting element 200 is an end surface light emitting type semiconductor light emitting element. Furthermore, the semiconductor light emitting element 200 is formed by a semiconductor processing technology such as a photolithography technology and an etching technology.

The semiconductor light emitting element 200 having such a configuration is mounted on the mounting substrate 300 through the joining layer 500 such that the second electrode 270 side is directed towards the mounting substrate 300 (mounted in a so-called junction down manner).
Mounting Substrate 300

In the mounting substrate 300, an upper surface (one main surface) thereof becomes a mounting surface on which the semiconductor light emitting element 200 is mounted, and a plurality of semiconductor light emitting elements 200 are mounted on the mounting surface in parallel. Such a mounting substrate 300 is configured of silicon (Si). However, the configuration material of the mounting substrate 300 is not limited to Si, and for example, the mounting substrate 300 may be configured of $Al_2O_3$ (alumina), AlN, and the like in addition to Si. For example, in a case where AlN is used, excellent heat conductivity is able to be exhibited compared to a case where Si is used.

In addition, a plurality of terminals 310 are arranged on the mounting surface of the mounting substrate 300 corresponding to the plurality of semiconductor light emitting elements 200. Furthermore, even though it is not illustrated, an insulating film (for example, a silicon oxide film) for ensuring insulating properties is formed on the mounting surface.

Thus, the semiconductor light emitting element 200 is joined onto each of the terminals 310 through the joining layer 500. The joining layer 500 has conductivity, mechanically fixes (joins) the semiconductor light emitting element 200 to the terminal 310, and electrically connects the second electrode 270 of the semiconductor light emitting element 200 to the terminal 310. In addition, each of the terminals 310 is electrically connected to the first electrode 260 of the semiconductor light emitting element 200, which is positioned on the adjacent terminal 310, through a bonding wire BY. That is, the plurality of semiconductor light emitting elements 200 are electrically connected to each other in series on the mounting substrate 300.

The thermal expansion coefficient (the linear expansion coefficient) of such a mounting substrate 300 is positioned between the thermal expansion coefficient (the linear expansion coefficient) of the semiconductor light emitting element 200 and the thermal expansion coefficient (the linear expansion coefficient) of the support substrate 400. Therefore, the mounting substrate 300 is interposed between the semiconductor light emitting element 200 and the support substrate 400, and thus, it is possible to reduce a stress which is generated due to a thermal expansion difference between the semiconductor light emitting element 200 and the support substrate 400 and is applied to the semiconductor light emitting element 200 or the support substrate 400. For this reason, it is possible to suppress the damage of the semiconductor light emitting element 200 or the support substrate 400 (for example, the occurrence of a crack), and to more stably obtain desired performance, and thus, high reliability is obtained.

Support Substrate 400

The support substrate 400 has a function as a heat radiating portion for radiating heat generated from the semiconductor light emitting element 200. Such a support substrate 400, for example, is able to be configured of Cu, Al, Mo, W, Si, C, Be, Au, a compound thereof (for example, AlN, BeO, and the like), an alloy (for example, CuMo and the like), or the like. In addition, the support substrate 400 is able to be configured of a combination of the materials exemplified above, for example, a multilayer structure of a copper (Cu) layer and a molybdenum (Mo) layer. The support substrate 400 is configured of such materials, and thus, the support substrate 400 having excellent heat radiating properties is obtained, and heat generated from the semiconductor light emitting element 200 is able to be efficiently radiated.

Joining Layers 500 and 600

The joining layer 500 is positioned between the semiconductor light emitting element 200 and the mounting substrate 300, and joins the semiconductor light emitting element 200 and the mounting substrate 300 together. On the other hand, the joining layer 600 is positioned between the mounting substrate 300 and the support substrate 400, and joins the mounting substrate 300 and the support substrate 400. Each of the joining layers 500 and 600 is configured of a sintered body of metal particles, and is formed by calcining a metal paste in which metal particles are dispersed in an organic solvent.

Such joining layers 500 and 600 have sufficiently high heat conductivity, and thus, the heat generated from the semiconductor light emitting element 200 is efficiently transferred to the support substrate 400 through the joining layer 500, the mounting substrate 300, and the joining layer 600.

Furthermore, the metal particles configuring the joining layers 500 and 600 are not particularly limited, and in particular, it is preferable to use silver particles, and in addition to this, for example, copper particles, gold particles, and the like are able to be used. By using the silver particles, the joining layers 500 and 600 having more excellent heat transfer properties are obtained. In addition, it is preferable that the joining layers 500 and 600, for example, include metal particles having different particle diameters of approximately 20 nm to 5 μm.

In addition, each of the joining layers 500 and 600 is a porous layer having a pore. Thus, the porosity (volume %) of the joining layer 500 is set to be lower than the porosity of the joining layer 600. That is, the joining layer 500 is denser than the joining layer 600. For this reason, the joining layer 500 has more excellent heat transfer properties than that of the joining layer 600, on the contrary, the joining layer 600 is softer than the joining layer 500, and has excellent stress relaxing properties. Therefore, the heat generated from the semiconductor light emitting element 200 is efficiently transferred to the outside of the semiconductor light emitting element 200 (that is, the mounting substrate 300 or the support substrate 400) through the joining layer 500, and a stress generated due to a thermal expansion coefficient difference between the mounting substrate 300 and the support substrate 400 is able to be effectively absorbed (relaxed) by the joining layer 600. As a result thereof, it is possible to suppress the damage of the mounting substrate 300 or the support substrate 400 (for example, the occurrence of a crack due to a thermal stress), and to obtain the light emitting device 100 having excellent heat radiating properties.

Here, as described above, the thermal expansion coefficient of the mounting substrate 300 is positioned between the thermal expansion coefficient of the semiconductor light emitting element 200 and the thermal expansion coefficient of the support substrate 400, and in this embodiment, a difference in the thermal expansion coefficient between the mounting substrate 300 and the support substrate 400 becomes greater than a difference in the thermal expansion coefficient between the semiconductor light emitting element 200 and the mounting substrate 300. That is, a stress is easily applied to the mounting substrate 300 or the support substrate 400 due to thermal expansion. For this reason, as described above, a comparatively soft (softer than the joining layer 500) joining layer 600 is arranged between the mounting substrate 300 and the support substrate 400, and thus, it is possible to more effectively relax the stress, and it is possible to more effectively suppress the damage thereof.

Furthermore, the porosity of the joining layer 500 is not particularly limited, but for example, is preferably greater than or equal to approximately 5 volume % and less than or equal to approximately 30 volume %, and is more preferably greater than or equal to approximately 10 volume % and less than or equal to approximately 20 volume %. On the other hand, the porosity of the joining layer 600 is not particularly limited, but for example, is preferably greater than or equal to approximately 20 volume % and less than or equal to approximately 40 volume %, and is more preferably greater than or equal to approximately 25 volume % and less than or equal to approximately 35 volume %. By setting the porosity of the joining layers 500 and 600 to be in the range described above, the effect described above is able to be more remarkably exhibited. Furthermore, the porosity is able to be calculated from a ratio of a pore and a structure (a metal portion) of a sectional surface of a sintered body of a metal paste (the joining layer 500 and the joining layer 600) as an example of a measurement method of the porosity.

In addition, the joining layer 600 is formed to be thicker than the joining layer 500. The joining layer 600 has a porosity higher than that of the joining layer 500, and thus, has heat transfer properties worse than the joining layer 500. Therefore, the joining layer 600 is formed to be thicker than the joining layer 500, and thus, the heat transfer properties of the joining layer 600 are improved. For this reason, the heat generated from the semiconductor light emitting element 200 is able to be more effectively radiated from the support substrate 400. In addition, the joining layer 600 is formed to be thicker than the joining layer 500, and thus, a stress generated due to a thermal expansion difference between the mounting substrate 300 and the support substrate 400 is able to be more effectively relaxed. Furthermore, the thermal expansion difference is a difference in an elongation (shrinkage) amount generated between two structures (members). For example, the mounting substrate 300 and the support substrate 400 respectively have different thermal expansion coefficients, and thus, a thermal expansion difference is generated between the mounting substrate 300 and the support substrate 400 when heat is applied.

Furthermore, the thickness (the average thickness) of the joining layer 500 is not particularly limited, but for example, is preferably greater than or equal to approximately 40 µm and less than or equal to approximately 60 µm. On the other hand, the thickness (the average thickness) of the joining layer 600 is not particularly limited, but for example, is preferably greater than or equal to approximately 50 µm and less than or equal to approximately 150 µm. By setting the thickness to be in the range described above, the effect described above is able to be more remarkably exhibited.

As described above, the light emitting device 100 has been described.

Next, a manufacturing method of the light emitting device 100 will be described.

As illustrated in FIG. 4, the manufacturing method of the light emitting device 100 includes a first calcining step of arranging a first metal paste 500A between the semiconductor light emitting element 200 and the mounting substrate 300, and of calcining the first metal paste 500A by heating, and a second calcining step of arranging a second metal paste 600A between the mounting substrate 300 and the support substrate 400, and of simultaneously calcining the first metal paste 500A and the second metal paste 600A by heating.

Hereinafter, such a manufacturing method will be described in detail.

First Calcining Step

Figure 5:
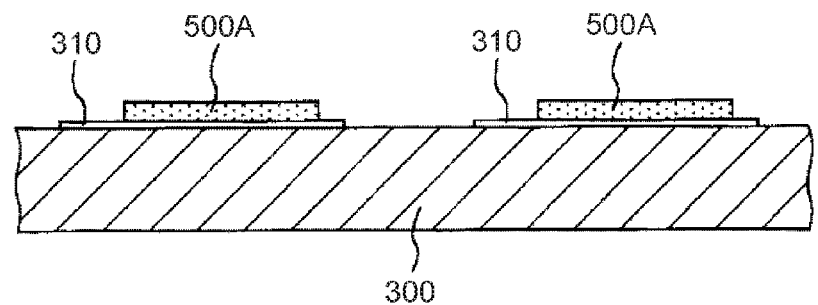
FIG. 5 is a sectional view illustrating the manufacturing method of the light emitting device illustrated in FIG. 1.
Figure 6:
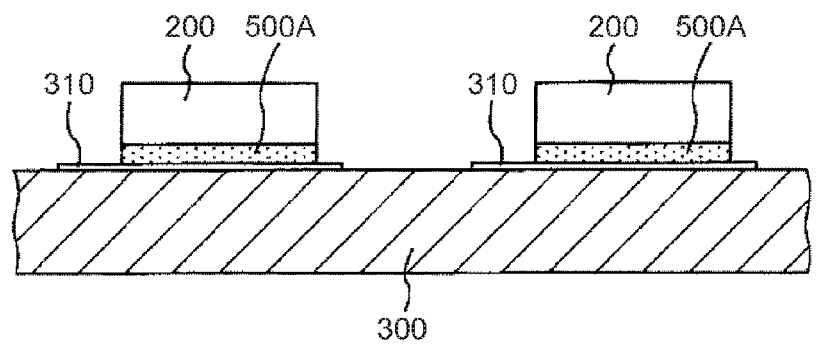
FIG. 6 is a sectional view illustrating the manufacturing method of the light emitting device illustrated in FIG. 1.

First, as illustrated in FIG. 5, the mounting substrate 300 is prepared, and the first metal paste 500A is applied onto an upper surface (the terminal 310) of the mounting substrate 300. Furthermore, a coating method of the first metal paste 500A is not particularly limited, and for example, various coating technologies such as a printing method, a dispense method, and a transfer method are able to be used. In addition, the first metal paste 500A is not particularly limited, and for example, a silver paste in which silver particles are dispersed in an organic solvent is able to be used. Gold particles or copper particles are able to be used as a material other than the silver particles. Next, as illustrated in FIG. 6, the semiconductor light emitting element 200 is arranged on the first metal paste 500A, and then, the first metal paste 500A is calcined by heating.

Second Calcining Step

Figure 7:
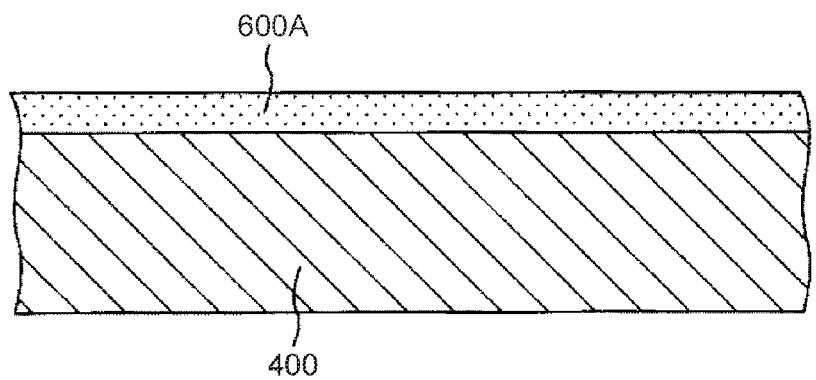
FIG. 7 is a sectional view illustrating the manufacturing method of the light emitting device illustrated in FIG. 1.
Figure 8:
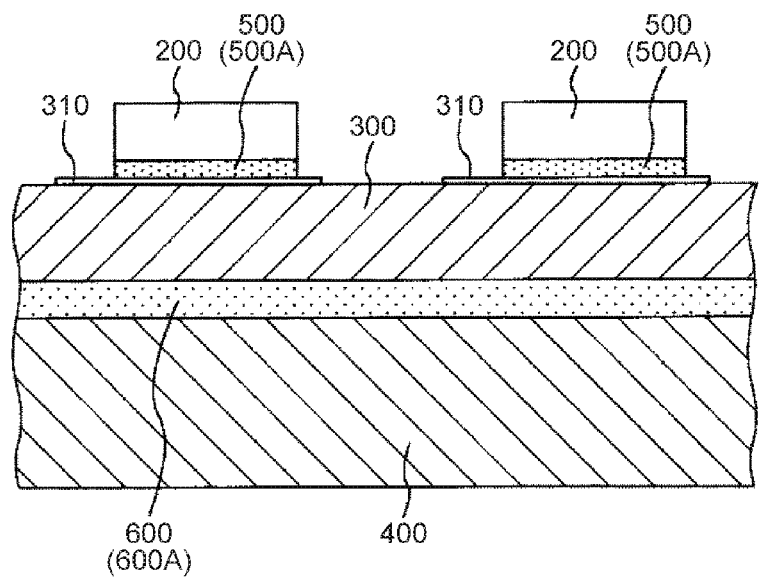
FIG. 8 is a sectional view illustrating the manufacturing method of the light emitting device illustrated in FIG. 1.

First, as illustrated in FIG. 7, the support substrate 400 is prepared, and the second metal paste 600A is applied onto an upper surface of the support substrate 400. Furthermore, a coating method of the second metal paste 600A is not particularly limited, and for example, various coating technologies such as a printing method, a dispense method, and a transfer method are able to be used. In addition, the second metal paste 600A is not particularly limited, and for example, a silver paste in which silver particles are dispersed in an organic solvent is able to be used. Gold particles or copper particles are able to be used as a material other than the silver particles. Furthermore, in this embodiment, the same material as that of the first metal paste 500A is used as the second metal paste 600A. Next, as illustrated in FIG. 8, the mounting substrate 300 is arranged on the second metal paste 600A, and then, the second metal paste 600A is calcined by heating.

Figure 9:
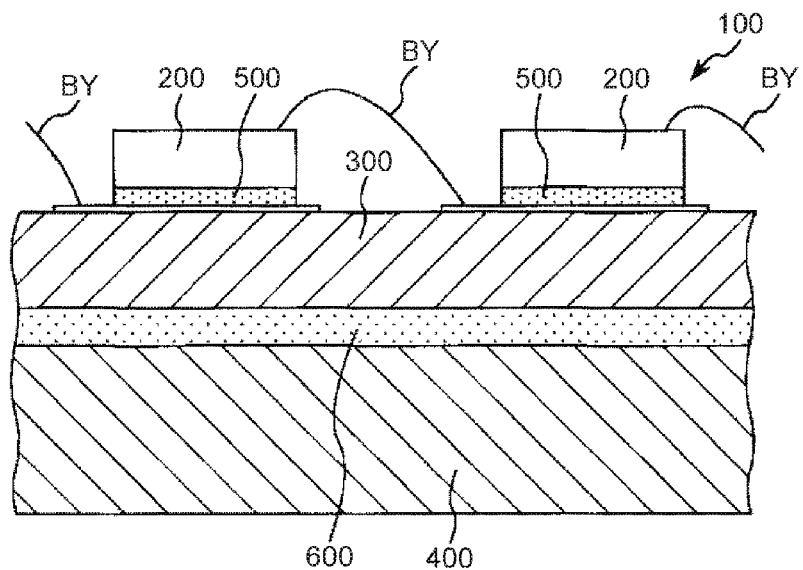
FIG. 9 is a sectional view illustrating the manufacturing method of the light emitting device illustrated in FIG. 1.

Finally, as illustrated in FIG. 9, the plurality of semiconductor light emitting elements 200 are connected in series by the bonding wire BY, and thus, the light emitting device 100 including the semiconductor light emitting element 200, the mounting substrate 300, the support substrate 400, the joining layer 500 which is a sintered body of the first metal paste 500A, and the joining layer 600 which is a sintered body of the second metal paste 600A is obtained. Furthermore, it is preferable that most of the constituent component of the sintered body is formed of a metal material (excluding a pore), and it is more preferable that greater than or equal to 90% of the constituent component is formed of the metal material. According to such a constituent component, it is possible to increase the heat transfer properties of the joining layer 500 and the joining layer 600. In addition, even in a case where residues such as components other than the metal material which are contained before the first metal paste 500A and the second metal paste 600A are sintered, or calcining components of the components other than the metal material which are contained before the first metal paste 500A and the second metal paste 600A are sintered are left, there is no practical problem.

Furthermore, the porosity may also include a portion occupied by the residues such as the components other than the metal material which are contained before the first metal paste 500A and the second metal paste 600A are sintered, or the calcining components of the components other than the metal material which are contained before the first metal paste 500A and the second metal paste 600A are sintered.

Here, it has been known that the porosity of the sintered body is able to be controlled according to calcining conditions (in particular, a calcining temperature and a calcining time), and in general, in a case where the calcining temperature decreases, the porosity increases, and in a case where the calcining time is shortened, the porosity increases. For this reason, it is preferable that setting the calcining temperature (a peak temperature) of the second calcining step to be lower than the calcining temperature of the first calcining step, setting the calcining time (a time for maintaining the peak temperature) to be shorter than the calcining time of the first calcining temperature, or both settings are performed. Accordingly, it is possible to simply and reliably form the joining layer 600 having a porosity lower than that of the joining layer 500. The calcining temperature, for example, is preferably higher than or equal to approximately 200° C. and lower than or equal to approximately 400° C., and is more preferably higher than or equal to approximately 250° C. and lower than or equal to approximately 350° C. The calcining time, for example, is preferably longer than or equal to approximately 10 minutes and shorter than or equal to approximately 100 minutes, and is more preferably longer than or equal to approximately 30 minutes and shorter than or equal to approximately 60 minutes.

Here, in a case of the invention, the first metal paste 500A is calcined in the first calcining step and the second calcining step, whereas the second metal paste 600A is calcined only in the second calcining step. For this reason, even in a case of setting the same calcining conditions in the first calcining step and the second calcining step, it is possible to set the calcining time of the second metal paste 600A to be shorter than the calcining time of the first metal paste 500A, and it is possible to simply and reliably form the joining layer 600 having a porosity lower than that of the joining layer 500.

In addition, in this embodiment, the first metal paste 500A and the second metal paste 600A are the same material, and it is possible to simply and reliably form the joining layer 600 having a porosity higher than that of the joining layer 500 by setting the first metal paste 500A and the second metal paste 600A to be different materials (in particular, a particle diameter of metal particles). Specifically, in a case where the particle diameter of the metal particles decreases, the porosity is lowered, and thus, for example, it is possible to simply and reliably form the joining layer 600 having a porosity higher than that of the joining layer 500 by setting the second metal paste 600A to be a material having a particle diameter greater than the particle diameter of the metal particles contained in the first metal paste 500A.

Second Embodiment

Figure 10:
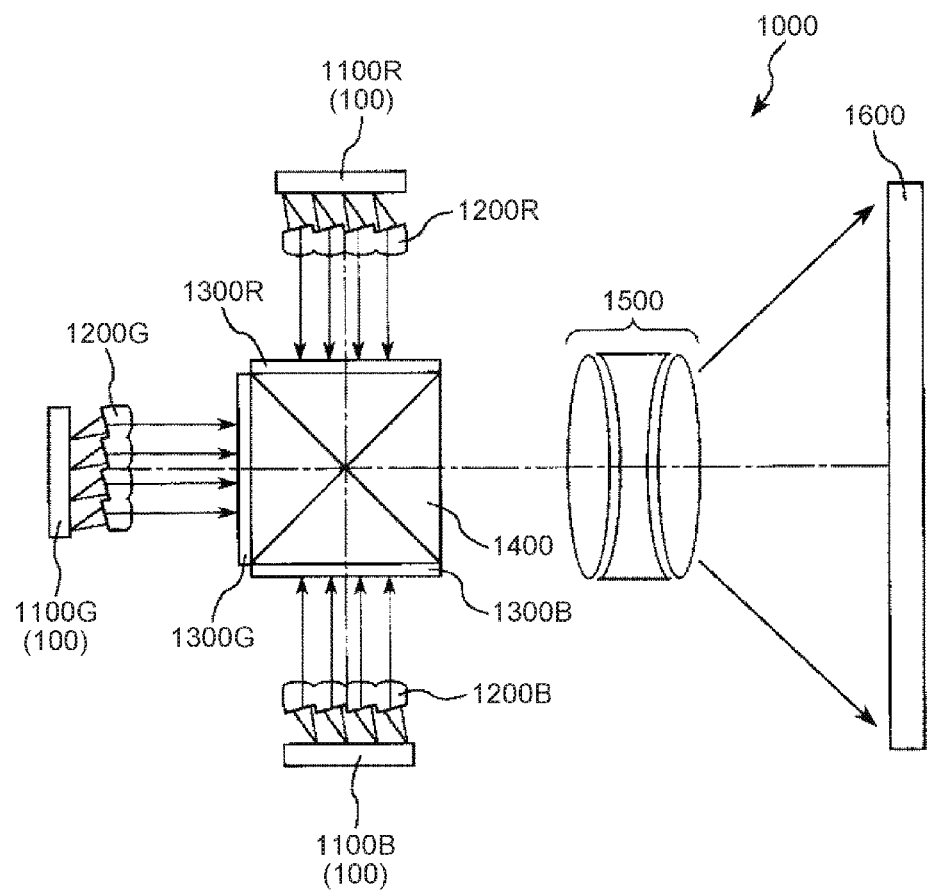
FIG. 10 is a diagram illustrating a projector according to a second embodiment of the invention.

FIG. 10 is a diagram illustrating a projector according to a second embodiment of the invention.

As illustrated in FIG. 10, a projector 1000 includes a red light source 1100R, a green light source 1100G, and a blue light source 1100B which allow red light, green light, and blue light to exit. Thus, the light emitting device 100 described above is used as the light sources 1100R, 1100G, and 1100B. Further, the projector 1000 includes lens arrays 1200R, 1200G, and 1200B, transmissive liquid crystal light bulbs (light modulating units) 1300R, 1300G, and 1300B, a cross dichroic prism 1400, and a projecting lens (a projecting unit) 1500.

Light exiting from the light sources 1100R, 1100G, and 1100B is incident on each of the lens arrays 1200R, 1200G, and 1200B. Incident surfaces of the lens arrays 1200R, 1200G, and 1200B, for example, are inclined to an optical axis of light exiting from the light sources 1100R, 1100G, and 1100B by a predetermined angle. Accordingly, it is possible to convert the optical axis of the light exiting from the light sources 1100R, 1100G, and 1100B. Therefore, for example, it is possible to set the light exiting from the light sources 1100R, 1100G, and 1100B to be orthogonal to irradiation surfaces of the liquid crystal light bulbs 1300R, 1300G, and 1300B.

In addition, the lens arrays 1200R, 1200G, and 1200B include curved surfaces on the liquid crystal light bulbs 1300R, 1300G, and 1300B sides. Accordingly, in the incident surfaces of the lens arrays 1200R, 1200G, and 1200B, the light of which the optical axis is converted is condensed by the curved convex surface (or it is possible to decrease a diffusion angle). Thus, the light condensed by each of the lens arrays 1200R, 1200G, and 1200B is incident on each of the liquid crystal light bulbs 1300R, 1300G, and 1300B. Each of the liquid crystal light bulbs 1300R, 1300G, and 1300B modulates the incident light according to each image information item.

Three-color light modulated by each of the liquid crystal light bulbs 1300R, 1300G, and 1300B is incident on the cross dichroic prism 1400 and is synthesized. The light synthesized by the cross dichroic prism 1400 is incident on the projecting lens 1500 which is a projection optical system. The projecting lens 1500 enlarges an image formed by the liquid crystal light bulbs 1300R, 1300G, and 1300B, and projects the image onto a screen (a display surface) 1600. Accordingly, a desired video is projected onto the screen 1600.

As described above, the projector 1000 has been described.

Furthermore, in the examples described above, a transmissive liquid crystal light bulb is used as the light modulating unit, and light bulbs other than the liquid crystal light bulb may be used, or a reflective light bulb may be used. Examples of such a light bulb include a reflective liquid crystal light bulb and a digital micromirror device. In addition, the configuration of the projection optical system is suitably changed according to the type of light bulb to be used.

In addition, the projector may be a scanning projector which scans light on a screen, and thus, displays an image having a desired size on a display surface.

As described above, the joined body, the electronic device, the projector, and the manufacturing method of a joined body according to the invention have been described on the basis of the illustrated embodiments, but the invention is not limited to the embodiments, and the configuration of each portion is able to be substituted with an arbitrary configuration having the same function. In addition, other arbitrary constituents may be added to the invention. In addition, each of the embodiments described above may be suitably combined.

The entire disclosure of Japanese Patent No. 2015-160835, filed Aug. 18, 2015 is expressly incorporated by reference herein.

What is claimed is:

1. A joined body comprising:
   a first member which is an exothermic body;
   a second member;
   a third member;
   a first joining layer which joins the first member and the second member together, is a sintered body of metal particles, and has a pore; and
   a second joining layer which joins the second member and the third member together, is a sintered body of metal particles, and has a pore,
   wherein a porosity of the first joining layer is lower than a porosity of the second joining layer.

2. The joined body according to claim 1,
   wherein a difference between a thermal expansion coefficient of the first member and a thermal expansion coefficient of the second member is less than a difference between the thermal expansion coefficient of the second member and a thermal expansion coefficient of the third member.

3. The joined body according to claim 1,
   wherein the second joining layer is thicker than the first joining layer.

4. The joined body according to claim 1,
   wherein the porosity of the first joining layer is greater than or equal to 5 volume % and less than or equal to 30 volume %, and the porosity of the second joining layer is greater than or equal to 20 volume % and less than or equal to 40 volume %.

5. An electronic device comprising:
   the joined body according to claim 1,
   wherein the first member is a semiconductor light emitting element, an electric circuit, or a power semiconductor element.

6. An electronic device comprising:
   the joined body according to claim 2,
   wherein the first member is a semiconductor light emitting element, an electric circuit, or a power semiconductor element.

7. An electronic device comprising:
   the joined body according to claim 3,
   wherein the first member is a semiconductor light emitting element, an electric circuit, or a power semiconductor element.

8. An electronic device comprising:
the joined body according to claim 4,
wherein the first member is a semiconductor light emitting element, an electric circuit, or a power semiconductor element.

9. A projector comprising:
a light emitting device including the joined body according to claim 1, in which the first member is a semiconductor light emitting element;
a light modulating unit which modulates light exiting from the light emitting device according to image information; and
a projecting unit which projects an image formed by the light modulating unit.

10. A projector comprising:
a light emitting device including the joined body according to claim 2, in which the first member is a semiconductor light emitting element;
a light modulating unit which modulates light exiting from the light emitting device according to image information; and
a projecting unit which projects an image formed by the light modulating unit.

11. A projector comprising:
a light emitting device including the joined body according to claim 3, in which the first member is a semiconductor light emitting element;
a light modulating unit which modulates light exiting from the light emitting device according to image information; and
a projecting unit which projects an image formed by the light modulating unit.

12. A projector comprising:
a light emitting device including the joined body according to claim 4, in which the first member is a semiconductor light emitting element;
a light modulating unit which modulates light exiting from the light emitting device according to image information; and
a projecting unit which projects an image formed by the light modulating unit.

13. A manufacturing method of a joined body comprising:
a first calcining step of arranging a first metal paste containing metal particles between a first member, which is an exothermic body, and a second member, and of calcining the first metal paste by heating; and
a second calcining step of arranging a second metal paste containing metal particles between the second member and the third member, and of simultaneously calcining the first metal paste and the second metal paste by heating,
wherein a porosity of a sintered body of the first metal paste is lower than a porosity of a sintered body of the second metal paste.

14. The manufacturing method of a joined body according to claim 13,
wherein a calcining temperature of the second calcining step is lower than a calcining temperature of the first calcining step.

15. The manufacturing method of a joined body according to claim 13,
wherein a calcining time of the second calcining step is shorter than a calcining time of the first calcining step.

* * * * *